(12) United States Patent
Chen et al.

(10) Patent No.: US 11,545,754 B2
(45) Date of Patent: Jan. 3, 2023

(54) ANTENNA OSCILLATOR UNIT (71) Applicant: Kunshan Luxshare RF Technology Co., Ltd., Kunshan (CN)

(72) Inventors: Lu Chen, Kunshan (CN); Cheng-Yu Xu, Kunshan (CN); Zheng-Guo Zhou, Kunshan (CN); Wan-Qiang Zhang, Kunshan (CN); Zhen-Hua Li, Kunshan (CN); Wen-Kai Xu, Kunshan (CN); Meng-Yun Gu, Kunshan (CN)

(73) Assignee: KUNSHAN LUXSHARE RF TECHNOLOGY CO., LTD., Kunshan (CN)

( * ) Notice: Subject to any disclaimer, the term of this patent is extended or adjusted under 35 U.S.C. 154(b) by 65 days.

(21) Appl. No.: 17/194,623

(22) Filed: Mar. 8, 2021

(65) Prior Publication Data
US 2021/0194136 A1   Jun. 24, 2021

(30) Foreign Application Priority Data

Dec. 17, 2020 (CN) .......................... 202011493500.5

(51) Int. Cl.
| | |
|---|---|
| *H01Q 9/16* | (2006.01) |
| *H01Q 23/00* | (2006.01) |
| *H01Q 1/12* | (2006.01) |
| *H03H 7/42* | (2006.01) |
| *H01Q 1/38* | (2006.01) |

(52) U.S. Cl.
CPC ................ *H01Q 9/16* (2013.01); *H01Q 1/12* (2013.01); *H01Q 1/38* (2013.01); *H01Q 23/00* (2013.01); *H03H 7/42* (2013.01)

(58) Field of Classification Search
CPC  H01Q 9/16; H01Q 1/12; H01Q 23/00; H01Q 5/321; H01Q 5/42; H01Q 21/26; H01Q 1/38; H01Q 1/50; H01Q 1/523; H03H 7/42; H01P 5/10
See application file for complete search history.

(56) References Cited

U.S. PATENT DOCUMENTS

| 10,205,226 B2 * | 2/2019 | Li | .......................... H01Q 19/10 |
| 2021/0210840 A1 * | 7/2021 | Xu | .......................... H01Q 21/26 |

FOREIGN PATENT DOCUMENTS

| CN | 207009668 U | * | 2/2018 | |
| CN | 209133685 U | | 7/2019 | |
| CN | 110165381 A | | 8/2019 | |
| CN | 111600116 A | * | 8/2020 | |
| CN | 112018490 A | * | 12/2020 | ........... H01Q 1/1207 |

* cited by examiner

*Primary Examiner* — Vibol Tan
(74) *Attorney, Agent, or Firm* — Birch, Stewart, Kolasch & Birch, LLP (57) ABSTRACT

An antenna oscillator unit includes a radiator and a balun support. The radiator is fixed to the balun support and includes a plurality of low-frequency oscillator arms circumferentially distributed along the balun support. Each of the low-frequency oscillator arms includes two radiating sections connected to each other and a connecting section connecting the two radiating sections to form a closed loop. The two radiating sections are substantially perpendicular to each other. The antenna oscillator unit of some embodiments can avoid mutual coupling of signals from the antenna oscillator unit and an adjacent high-frequency oscillator and can improve the capability to radiate electromagnetic signals.

14 Claims, 12 Drawing Sheets

ANTENNA OSCILLATOR UNIT

CROSS-REFERENCE TO RELATED APPLICATION

This non-provisional application claims priority under 35 U.S.C. § 119(a) to Patent Application No. 202011493500.5 filed in China, P.R.C. on Dec. 17, 2020, the entire contents of which are hereby incorporated by reference.

BACKGROUND

Technical Field

The present invention relates to the field of communication technologies, and in particular, to an antenna oscillator unit.

Related Art

In the prior art, a multi-frequency antenna array has a plurality of low-frequency antenna oscillator units and a plurality of high-frequency antenna oscillator units that are arranged in an alternating manner. Generally, oscillator arms of both the low-frequency antenna oscillator unit and the high-frequency antenna oscillator unit are placed at plus and minus 45 degrees on a metal reflector, that is, the oscillator arms of the low-frequency antenna oscillator unit and the high-frequency antenna oscillator unit are arranged in parallel. Since the oscillator arm of the low-frequency oscillator is relatively long, it is likely to shield the high-frequency oscillator located below, which increases coupling between a high frequency band and a low frequency band, impeding radiation of electromagnetic waves.

SUMMARY

The present invention provides an antenna oscillator unit to resolve signal coupling caused by shielding of a high-frequency oscillator in the prior art by a low-frequency oscillator unit.

In order to resolve the above technical problem, the present invention provides an antenna oscillator unit, including a radiator and a balun support. The radiator is fixed to the balun support, and the radiator includes a plurality of low-frequency oscillator arms circumferentially distributed along the balun support. Each of the low-frequency oscillator arms includes two radiating sections connected to each other and a connecting section connecting the two radiating sections to form a closed loop. The two radiating sections are substantially perpendicular to each other.

In the above antenna oscillator unit, a structure of the low-frequency oscillator arm is mainly improved. The low-frequency oscillator arm is designed to a triangular structure including two radiating sections and a connecting section. Such a design can reduce shielding of the high-frequency oscillator by a traditional oblique low-frequency oscillator arm (for example, placed at minus 45 degrees), thus avoiding mutual coupling between a high frequency band and a low frequency band in a limited design space.

In addition, the two radiating sections are substantially perpendicular to each other and mate with the balun support to generate polarization and achieve directions of polarization of plus and minus 45 degrees.

Furthermore, the connecting section can eliminate a residual current at an end, optimize the purity of polarization, improve isolation of heteropolarization, and effectively converge a beam width. In addition, the radiating section and the connecting section are connected to form a loop, which expands a coverage area of the low-frequency oscillator arm, increasing structural strength of the low-frequency oscillator arm.

Further, the connecting section includes two first connecting portions respectively connected to the two radiating sections of the corresponding low-frequency oscillator arm and a second connecting portion connected between the two first connecting portions, where an avoidance opening is formed between the two first connecting portions and the second connecting portion for avoiding a high-frequency oscillator.

Further, each of the first connecting portions includes a first connecting line parallel to one of the radiating sections of the adjacent low-frequency oscillator arm, and each of the first connecting portions further includes a second connecting line connected to and perpendicular to the adjacent radiating section.

Further, each of the first connecting portions further includes a first loading block connected between the corresponding second connecting line and the corresponding radiating section.

Further, the second connecting portion includes a second loading block connected between the two first connecting portions.

Further, included angles between an extension line of the second loading block and the two adjacent radiating sections are between 35 degrees and 55 degrees.

Further, an extension line of the second loading block intersects with the two adjacent radiating sections to form two points of intersection, where a distance from each of the points of intersection to a center surrounded by the plurality of low-frequency oscillator arms is between 25 millimeters and 40 millimeters.

Further, a number of the low-frequency oscillator arms is four, and two adjacent radiating sections of the two adjacent low-frequency oscillator arms are parallel to each other.

Further, each of the low-frequency oscillator arms further includes a plurality of loading blocks.

Further, each of the low-frequency oscillator arms further includes a bulk feeding portion connected between the two radiating sections.

Further, the radiator further includes a substrate, where the plurality of low-frequency oscillator arms are disposed on the substrate.

Further, a mounting groove mating with the balun support is provided on each of the low-frequency oscillator arms.

Further, the balun support includes two cross-engaged balun boards, where each of the balun boards has a first surface, a second surface opposite to the first surface, a feeding line on the first surface, and a balun line on the second surface.

Further, the feeding line includes a plurality of bulk portions and a plurality of zigzag portions that are alternately connected.

Further, the balun line includes two elongated balun blocks respectively arranged on both sides of the other of the balun boards.

Further, the antenna oscillator unit further includes a feeding board fixed to the balun support.

The following describes the present invention in detail with reference to the accompanying drawings and specific embodiments, but should not be used as a limitation on the present invention.

DETAILED DESCRIPTION

A structural principle and a working principle of the present invention are described below in detail with reference to the accompanying drawings.

Figure 1:
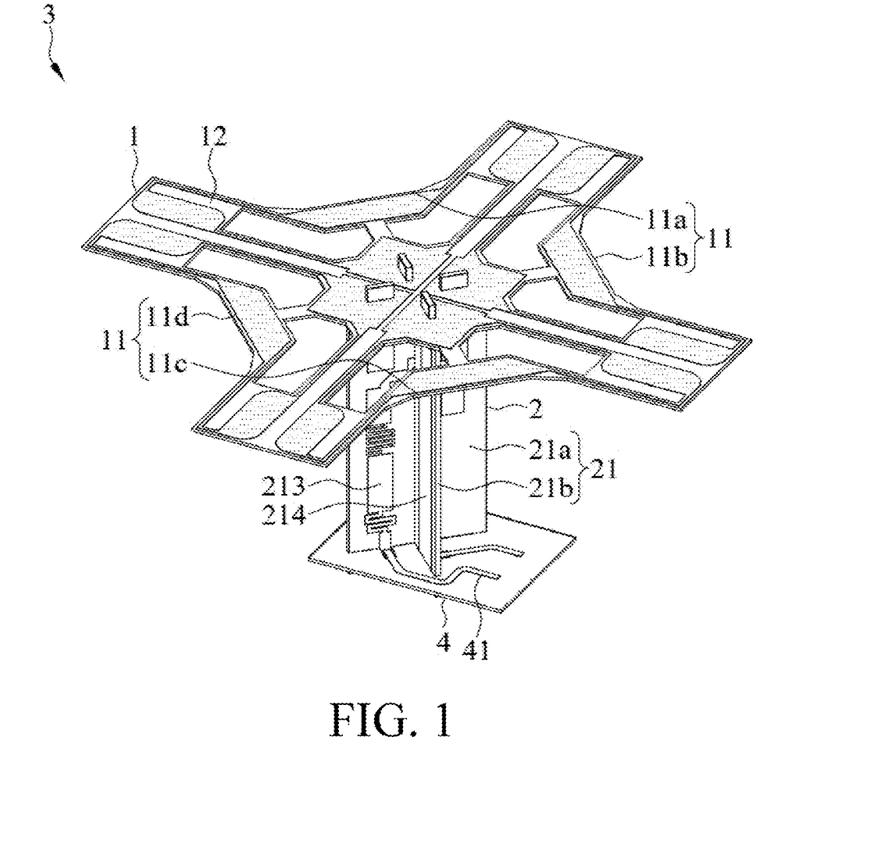
FIG. 1 is a three-dimensional view of an antenna oscillator unit according to a first embodiment of the present invention.
Figure 2:
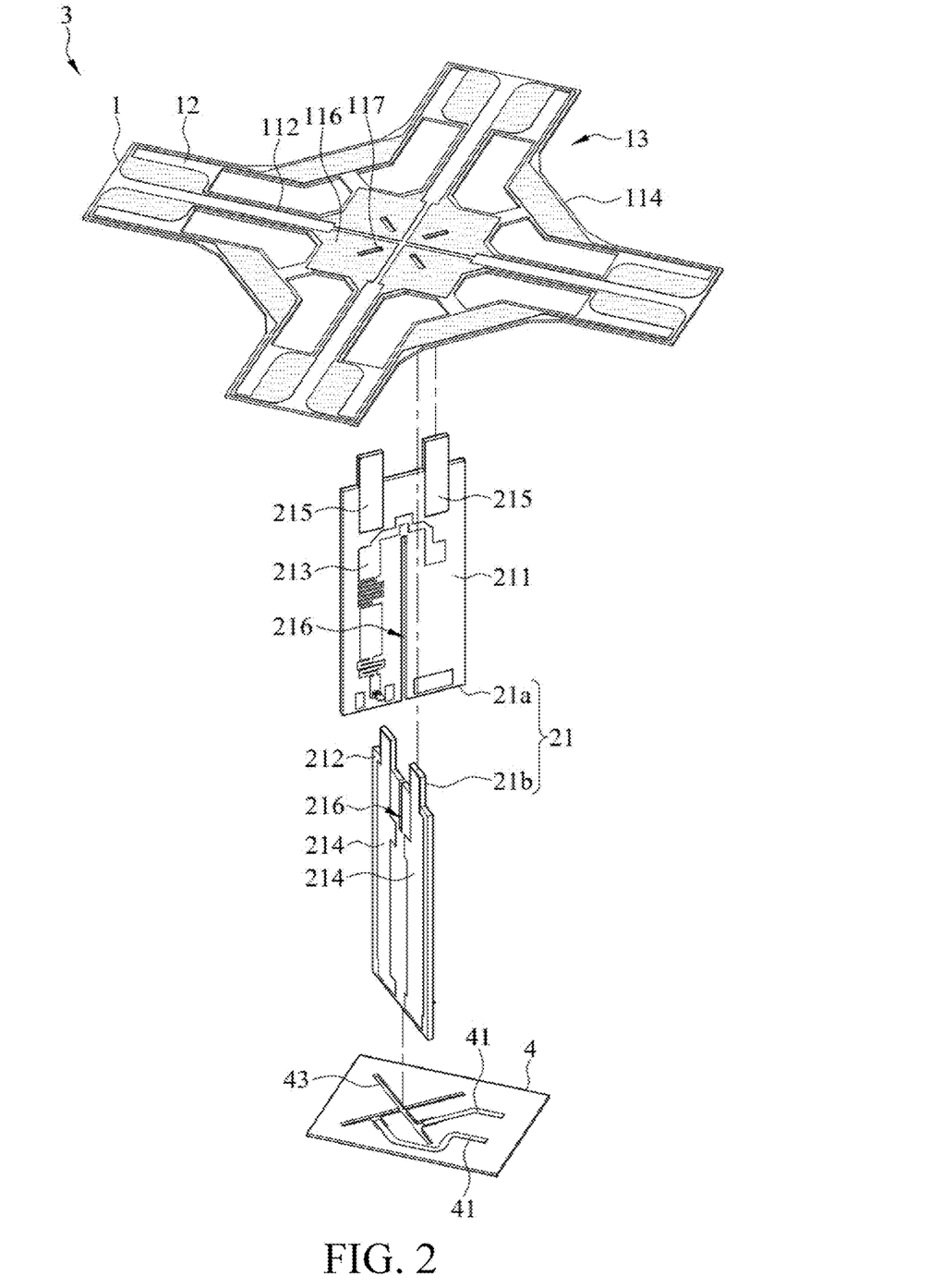
FIG. 2 is an exploded view of the antenna oscillator unit according to the first embodiment of the present invention.

FIG. 1 and FIG. 2 are respectively a three-dimensional view and an exploded view of an antenna oscillator unit 3 according to a first embodiment of the present invention. The antenna oscillator unit 3 includes a radiator 1 and a balun support 2. The radiator 1 is fixed to the balun support 2. The radiator 1 includes a plurality of low-frequency oscillator arms 11 circumferentially distributed along the balun support 2. In this embodiment, for example, the number of low-frequency oscillator arms 11 is four, but the present invention is not limited thereto. The balun support 2 has a feeding line 213 and a balun line 214. The feeding line 213 is electrically connected to the radiator 1 to feed the radiator 1. The balun line 214 balances the feeding.

In an embodiment, the antenna oscillator unit 3 further includes a feeding board 4. The radiator 1 and the feeding board 4 are respectively fixed to both ends of the balun support 2. The feeding board 4 has at least one feeding signal line 41 (for example, two feeding signal lines herein). The feeding signal line 41 is electrically connected to the feeding line 213.

In some embodiments, in the antenna oscillator unit 3, the feeding board 4 may be absent and feeding may be performed in other ways (for example, through a coaxial cable).

Figure 3A:
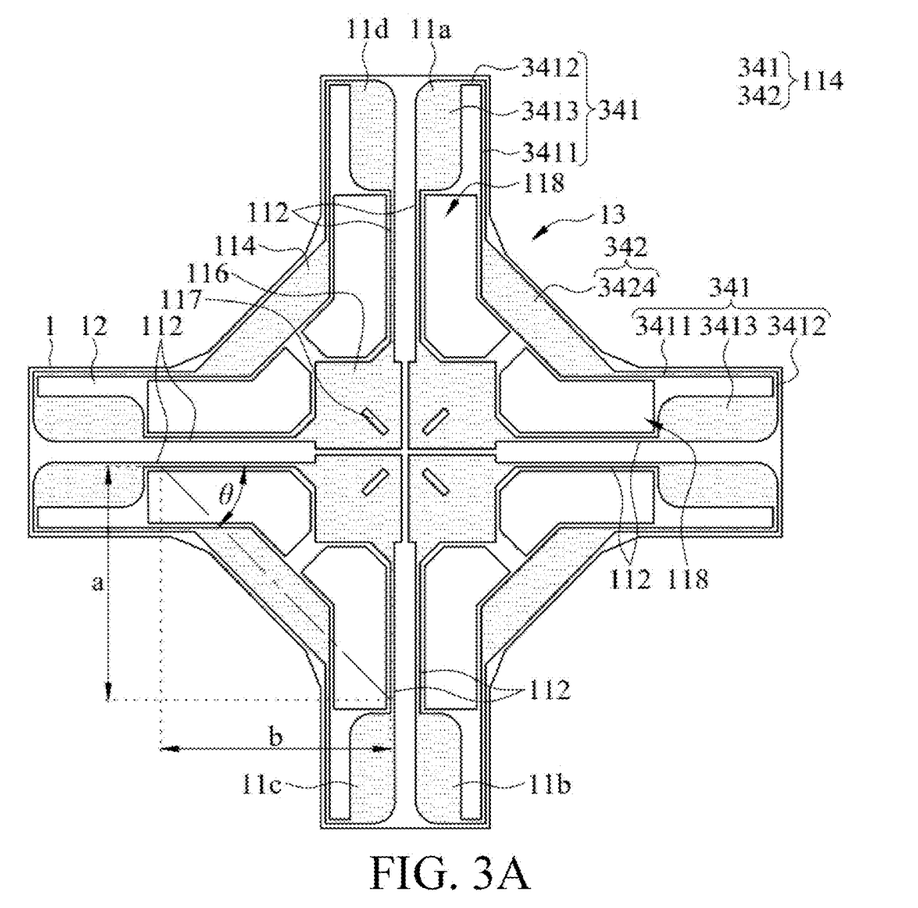
FIG. 3A is a top view of a radiator according to the first embodiment of the present invention.
Figure 3B:
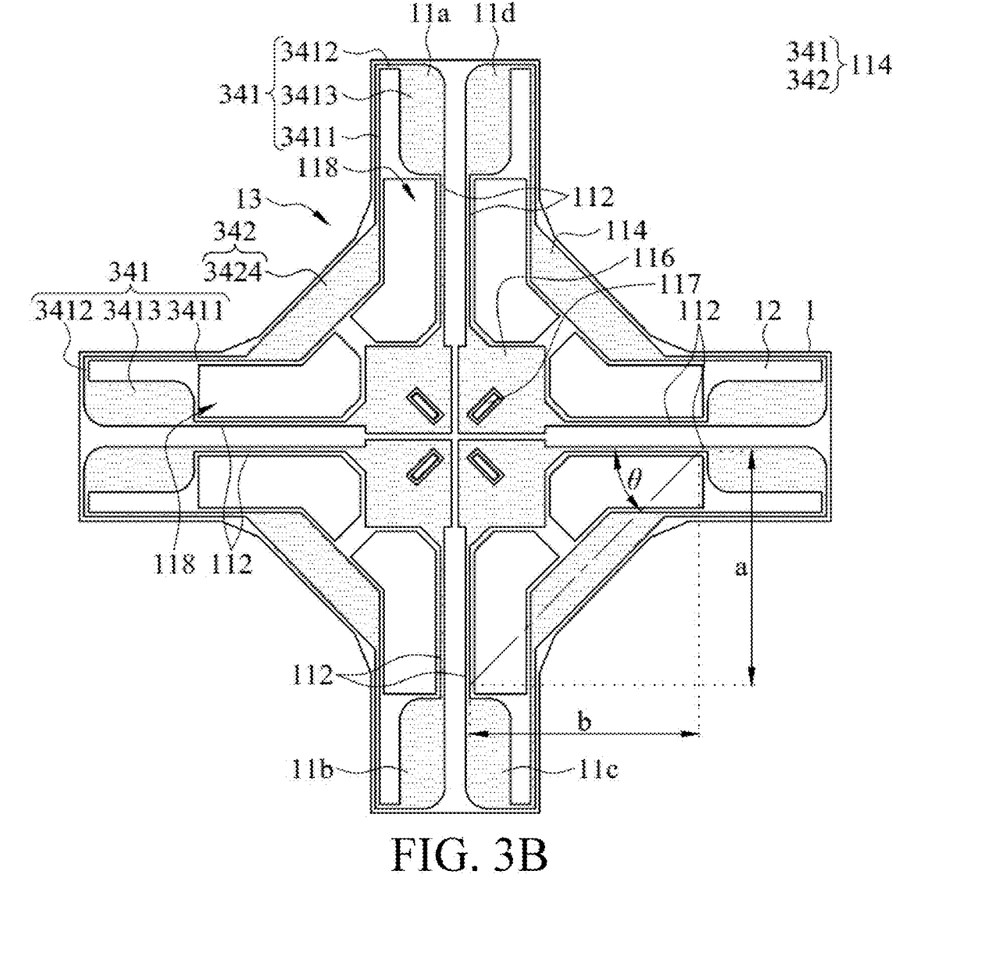
FIG. 3B is a bottom view of the radiator according to the first embodiment of the present invention.

FIG. 3A and FIG. 3B are respectively a top view and a bottom view of a radiator 1 according to the first embodiment of the present invention. In this embodiment, the radiator 1 is implemented by a printed circuit board, and therefore the radiator 1 further includes a substrate 12 on which the low-frequency oscillator arm 11 is disposed. Two sides of the substrate 12 respectively have a conductive pattern composed of four low-frequency oscillator arms 11 shown in FIG. 3A and FIG. 3B. A difference between the two is that the conductive pattern shown in FIG. 3A is connected to a mounting groove 117, and the conductive pattern shown in FIG. 3B is not connected to the mounting groove 117 with a gap left. The conductive patterns on the two sides are electrically connected through a plurality of vias (not shown herein for clarity) to form four low-frequency oscillator arms 11 capable of conducting excitation currents. In some embodiments, the conductive pattern shown in FIG. 3A may be arranged on only one side of the printed circuit board without a need to arrange the conductive pattern shown in FIG. 3B on the other side. Certainly, it may be understood that the radiator 1 may also not be additionally provided with the substrate 12.

As shown in FIG. 3A and FIG. 3B, the four low-frequency oscillator arms 11 are orthogonal to each other two by two to form two orthogonal radiating combinations. In other words, two opposite low-frequency oscillator arms 11 (for example, low-frequency oscillator arms 11a, 11c) form a radiating combination. The other two opposite low-frequency oscillator arms 11 (for example, low-frequency oscillator arms 11b, 11d) form another radiating combination. The four low-frequency oscillator arms 11 have the same shape and are point-symmetrical about the center surrounded by the four low-frequency oscillator arms 11. One of the radiating combinations receives excitation currents in a first polarization direction (hereinafter referred to as "first excitation currents"), and the other of the radiating combinations receive excitation currents in a second polarization direction (hereinafter referred to as "second excitation currents"). The first polarization direction and the second polarization direction are orthogonal to each other. In this embodiment, the first polarization direction and the second polarization direction are respectively plus and minus 45 degrees. Signals of the first excitation current and the second excitation current are equal in amplitude and phase.

As shown in FIG. 3A and FIG. 3B, each of the low-frequency oscillator arms 11 includes two radiating sections 112, one connecting section 114, and one bulk feeding portion 116. The two radiating sections 112 are connected to and substantially perpendicular to each other. The expression "substantially perpendicular" means that the two radiating sections 112 are substantially in a 90-degree positional relationship. In other words, an included angle between the two radiating sections 112 includes but is not limited to 90 degrees. The bulk feeding portion 116 is connected to the two radiating sections 112, that is, one ends of the two radiating sections 112 are connected to the bulk feeding portion 116 and extend along both sides. Specifically, the two radiating sections 112 respectively extend along outer edges of the low-frequency oscillator arms 11 on two adjacent sides. For example, one of the radiating sections 112 of the low-frequency oscillator arm 11b extends along an outer side of the low-frequency oscillator arm 11a and is closely adjacent to one of the radiating sections 112 of the low-frequency oscillator arm 11a. The other one of the radiating sections 112 of the low-frequency oscillator arm 11b extends along an outer side of the low-frequency oscillator arm 11c and is closely adjacent to one of the radiating sections 112 of the low-frequency oscillator arm 11c. In other words, two adjacent radiating sections 112 of the two adjacent low-frequency oscillator arms 11 are parallel to each other. The two radiating sections 112 of each of the low-frequency oscillator arms 11 respectively extend in a vertical direction and a horizontal direction to jointly generate polarization with the balun support 2 and achieve directions of polarization of plus and minus 45 degrees.

As shown in FIG. 3A and FIG. 3B, the connecting section 114 is connected to ends of the two radiating sections 112 to connect the two radiating sections 112 to form a closed loop. In this way, residual currents at the ends can be eliminated, and purity of the polarization can be optimized. In addition, since the connecting section 114 increases a length of a current path, a beam width can be effectively restricted. Moreover, the connecting section 114 increases an area of the substrate 12, so that structural strength of the low-frequency oscillator arm 11 can be increased. One or more hollowed regions 118 may be provided on the substrate 12, which are located inside the closed loop formed by the two radiating sections 112 and the connecting section 114, to reduce a weight of the board and enhance stability of the antenna oscillator unit 3. In this embodiment, there are two hollowed regions 118 in a region covered by each of the low-frequency oscillator arms 11.

As shown in FIG. 3A and FIG. 3B, the connecting section 114 includes two first connecting portions 341 and a second connecting portion 342. The two first connecting portions 341 are respectively connected to an end of one of the radiating sections 112. The second connecting portion 342 is connected between the two first connecting portions 341. An avoidance opening 13 is formed between the two first connecting portions 341 and the second connecting portion 342. In this way, signal interference caused by overlapping other antenna oscillator arms that are closely disposed in the directions of plus and minus 45 degrees can be avoided. Specifically, each of the first connecting portion 341 includes a first connecting line 3411. The first connecting line 3411 is parallel to a radiating section 112 adjacent to the first connecting line. In other words, a direction in which the first connecting line 3411 extends is parallel to a direction in which the radiating section 112 extends. In this embodiment, the two first connecting lines 3411 respectively extend in a vertical direction and a horizontal direction.

As shown in FIG. 3A and FIG. 3B, each of the first connecting portions 341 further includes a second connecting line 3412 connected to and perpendicular to the adjacent radiating section 112. The radiating section 112 is connected to the first connecting line 3411 through the second connecting line 3412. In other words, the second connecting line is located between the corresponding first connecting line 3411 and radiating section 112.

As shown in FIG. 3A and FIG. 3B, the low-frequency oscillator arm 11 further includes a plurality of loading blocks. Specifically, each of the first connecting portions 341 further includes a first loading block 3413 connected between the corresponding second connecting line 3412 and the corresponding radiating section 112. The second connecting portion 342 includes a second loading block 3424 connected between the first connecting lines 3411 of the two first connecting portions 341. The above radiating section 112, first connecting line 3411, and second connecting line 3412 are wires that are much thinner than the loading block, so that radiation energy of other antenna oscillator units can be effectively consumed after being coupled to the wires, thus reducing electromagnetic coupling. The loading blocks are alternately connected between the wires, which can effectively change impedance of the low-frequency oscillator arm 11, thus providing good impedance matching characteristics.

As shown in FIG. 3A, included angles θ between an extension line of the second loading block 3424 and the two adjacent radiating sections 112 are between 35 degrees and 55 degrees. Preferably, the included angle θ is 45 degrees such that the entire low-frequency oscillator structure is more symmetrical, thereby obtaining a more symmetrical lobe pattern and better cross-polarization performance.

As shown in FIG. 3A, the extension line of the second loading block 3424 intersects with the two adjacent radiating sections 112 intersect to form two points of intersection. Distances a and b from the two points of intersection to the center surrounded by the low-frequency oscillator arms 11 are between millimeters 25 and 40 millimeters. Therefore, the second loading block 3424 can be as close as possible to the center surrounded by the low-frequency oscillator arms 11, so that the avoidance opening 13 can be as large as possible, thereby minimizing the signal interference.

In this embodiment, the plurality of vias connecting the conductive patterns on both sides of the substrate 12 are distributed in the bulk feeding portion 116 and the loading block (that is, the first loading block 3413 and the second loading block 3424).

Figure 4A:
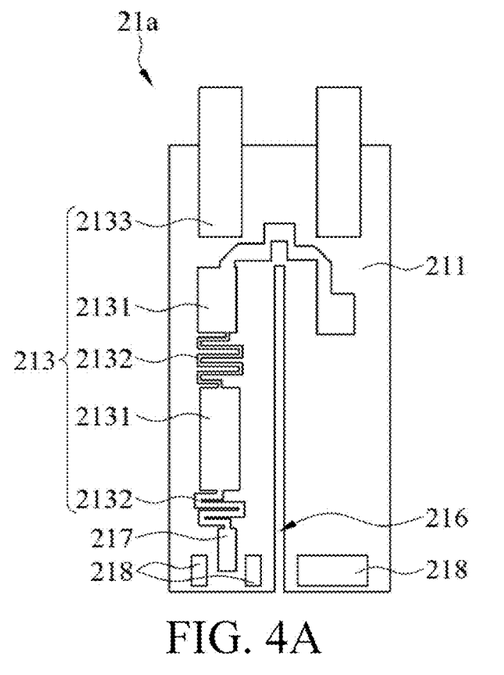
FIG. 4A is a top view of a balun board according to the first embodiment of the present invention.
Figure 4B:
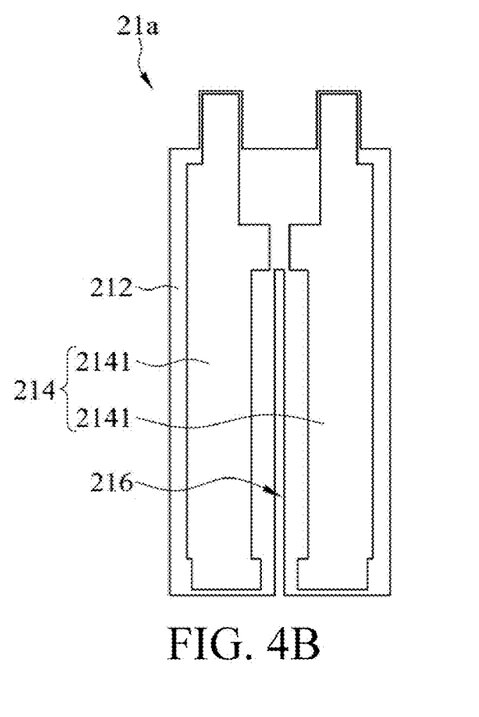
FIG. 4B is a bottom view of the balun board according to the first embodiment of the present invention.
Figure 5A:
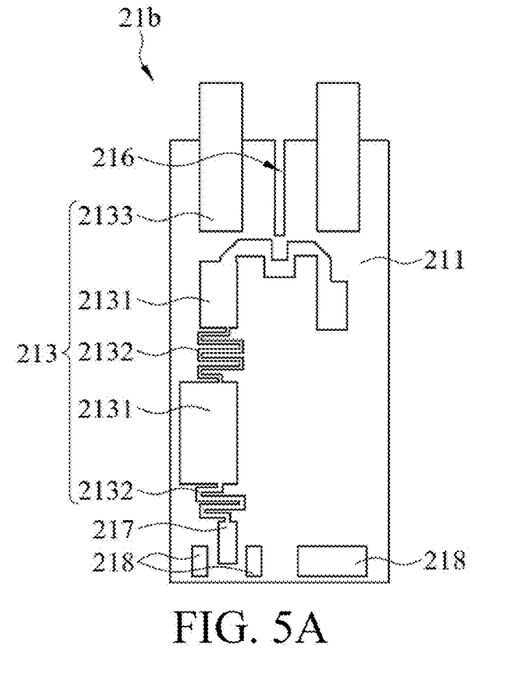
FIG. 5A is a top view of another balun board according to the first embodiment of the present invention.
Figure 5B:
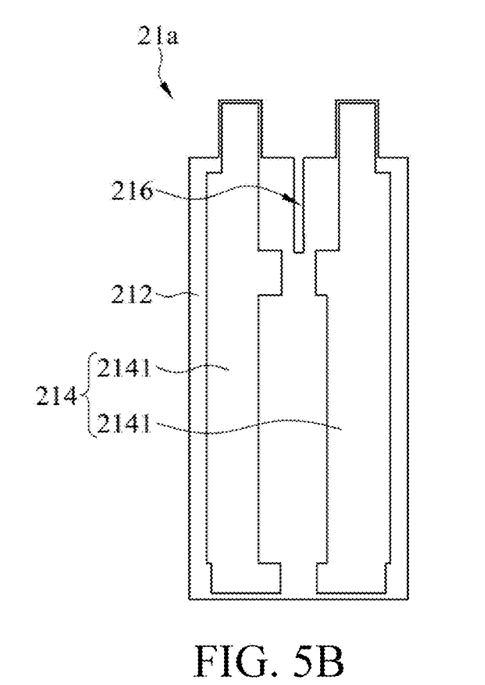
FIG. 5B is a bottom view of the another balun board according to the first embodiment of the present invention.

Referring to FIG. 1 and FIG. 2, the balun support 2 includes two cross-engaged balun boards 21 (that is, balun boards 21a, 21b). The balun board 21 is implemented by a printed circuit board. FIG. 4A and FIG. 4B are respectively a top view and a bottom view of a balun board 21 (21a) according to the first embodiment of the present invention. FIG. 5A and FIG. 5B are respectively a topic view and a bottom view of another balun board 21 (21b) according to the first embodiment of the present invention. Referring to FIG. 1, FIG. 2, FIG. 4A, and FIG. 5A together, the two balun boards 21 respectively have a notch 216, which are crosswise engaged to each other through the notches 216 to form a balun support 2 with a cross-shaped section. The balun board 21 has a first surface 211, a second surface 212 opposite to the first surface 211, a feeding line 213 on the first surface 211, and a balun line 214 on the second surface 212. The feeding line 213 includes a plurality of bulk portions 2131 and a plurality of zigzag portions 2132 that are alternately connected to provide proper impedance matching. The zigzag portions 2132 are implemented by wires meandering back and forth. A width of the bulk portions 2131 is greater than a width of the wires of the zigzag portions 2132. The balun line 214 includes two elongated balun blocks 2141 respectively arranged on both sides of the other of the balun boards 21. As shown in FIG. 2, the two elongated balun blocks 2141 of the balun board 21b are respectively arranged on both sides of the balun board 21a.

Referring to FIG. 1, FIG. 2, FIG. 3A, FIG. 4A, and FIG. 5A together, the bulk feeding portion 116 of the low-frequency oscillator arm 11 has a mounting groove 117 for a protrusion at an upper end of the balun board 21 to pass through. The feeding line 213 further includes a feeding section 2133 located at the protrusion, so that the feeding section 2133 can be electrically connected to the bulk feeding portion 116 after passing through the mounting groove 117, thereby transmitting an excitation current to the two low-frequency oscillator arms 11 in the same radiating combination. In an embodiment, the feeding section 2133 is electrically connected to the bulk feeding portion 116 through welding. In this embodiment, the feeding section 2133 is not connected to the bulk portion 2131 or the zigzag portion 2132, but performs feeding through electrical coupling. In some embodiments, the feeding section 2133 may also be connected to the bulk portion 2131 or the zigzag portion 2132, and performs feeding through direct connection.

As shown in FIG. 4A and FIG. 5A, a feeding port 217 and a plurality of grounding ports 218 are further provided on the first surface 211 of the balun board 21. The feeding port 217 is connected to the feeding line 213 such that the feeding line 213 can obtain an excitation current through the feeding port 217. Referring to FIG. 4A, FIG. 4B, FIG. 5A, and FIG. 5B together, a position of the grounding port 218 corresponds to a position of the elongated balun block 2141 on the second surface 212. The grounding port 218 is electrically connected to the elongated balun block 2141 through a plurality of vias, so that the elongated balun block 2141 can obtain a ground signal through the grounding port 218.

Figure 6:
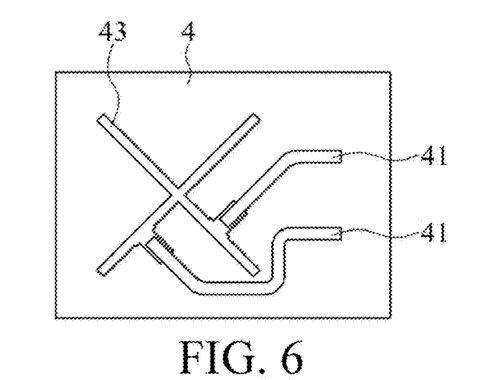
FIG. 6 is a top view of a feeding board according to the first embodiment of the present invention.

FIG. 6 is a top view of a feeding board 4 according to the first embodiment of the present invention. The feeding board 4 is implemented by a printed circuit board, and has a fixing groove 43 with the same shape (a cross shape herein) as a bottom end of the balun support 2 and two feeding signal lines 41. In this embodiment, the two feeding signal lines 41 are located on the same surface, but the present invention is not limited thereto. The two feeding signal lines 41 are located on a surface adjacent to a radiator 1. The two feeding signal lines 41 respectively transmit a first excitation current and a second excitation current.

Figure 7:
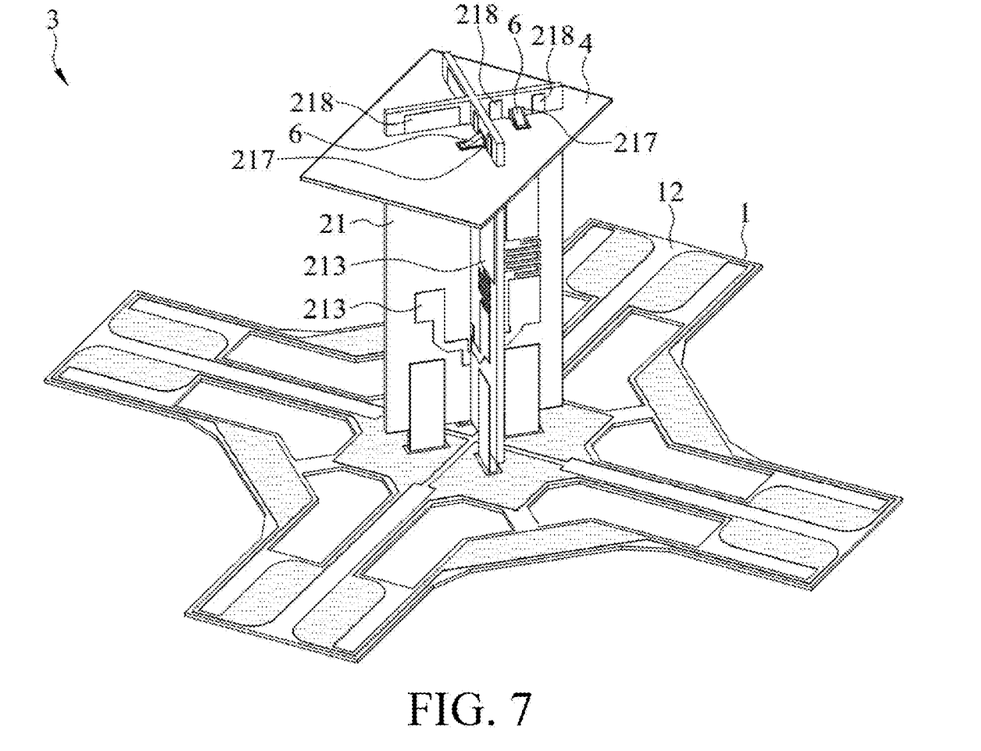
FIG. 7 is another three-dimensional view of an antenna oscillator unit according to the first embodiment of the present invention.

Referring to FIG. 6 and FIG. 7 together, FIG. 7 is another three-dimensional view of an antenna oscillator unit 3 according to the first embodiment of the present invention. The antenna oscillator unit 3 further includes two conductors 6 located on a surface of the feeding board 4 away from the radiator 1 and respectively connected to one of the feeding signal lines 41. After bottom ends of the two balun boards 21 of the balun support 2 pass through the fixing groove 43, the two conductors 6 are respectively electrically connected to the feeding port 217 of one of the balun boards 212. In an embodiment, the conductor 6 is electrically connected to the feeding port 217 through welding.

Referring to FIG. 7, further, included angles between the balun boards and the radiating sections of the low-frequency oscillator arms located above are each 45 degrees, so that the balun boards can better mate with the low-frequency oscillator arms to generate polarization and achieve directions of polarization of plus and minus 45 degrees.

Figure 8:
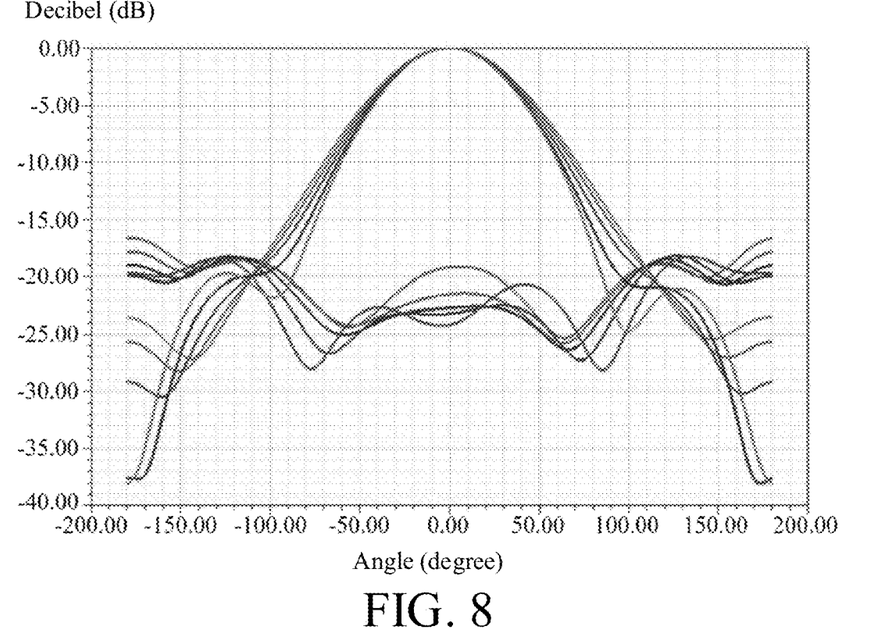
FIG. 8 is a horizontal plan view of the antenna oscillator unit according to the first embodiment of the present invention.

FIG. 8 is a horizontal plan view of the antenna oscillator unit 3 according to the first embodiment of the present invention. It may be seen that for five typical frequency points of 698 MHz, 747 MHZ, 796 MHz, 845 MHZ, and 894 MHz selected from 698 MHz to 894 MHz, beam widths are 64.7-73.2 degrees, cross polarization is −19.2 dB, and a front-to-rear ratio is −23.5 dB.

Figure 9:
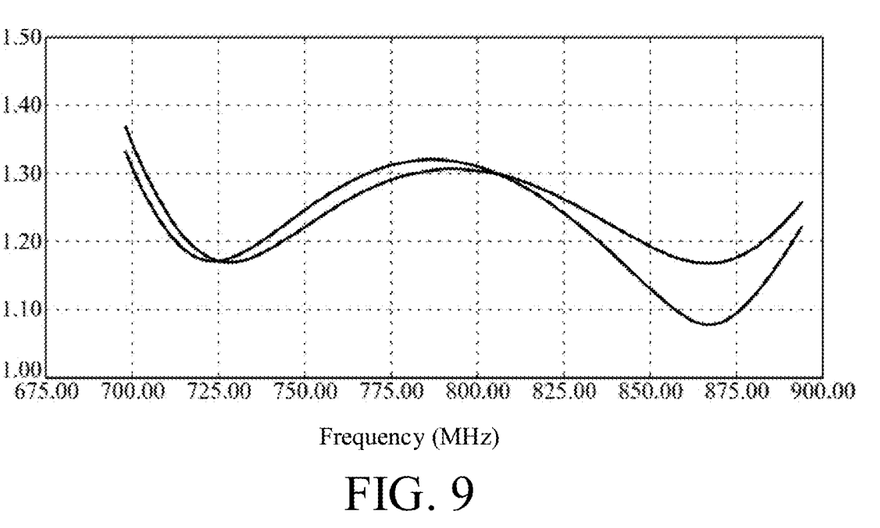
FIG. 9 is a graph of a standing wave ratio of the antenna oscillator unit according to the first embodiment of the present invention.

FIG. 9 is a graph of a standing wave ratio of the antenna oscillator unit 3 according to the first embodiment of the present invention. It may be seen that a standing wave ratio is less than 1.40 within the frequency band of 698 MHz to 894 MHz.

Figure 10:
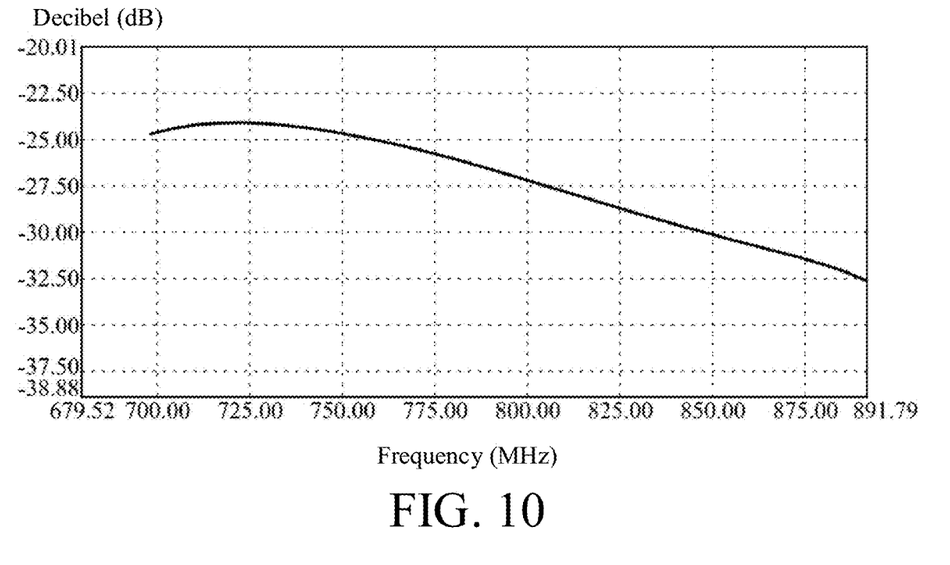
FIG. 10 is a graph of isolation of heteropolarization of the antenna oscillator unit according to the first embodiment of the present invention.

FIG. 10 is a diagram of isolation of heteropolarization of the antenna oscillator unit 3 according to the first embodiment of the present invention. It may be seen that isolation is less than −24.1 dB within the frequency band of 698 MHz to 894 MHz.

Figure 11:
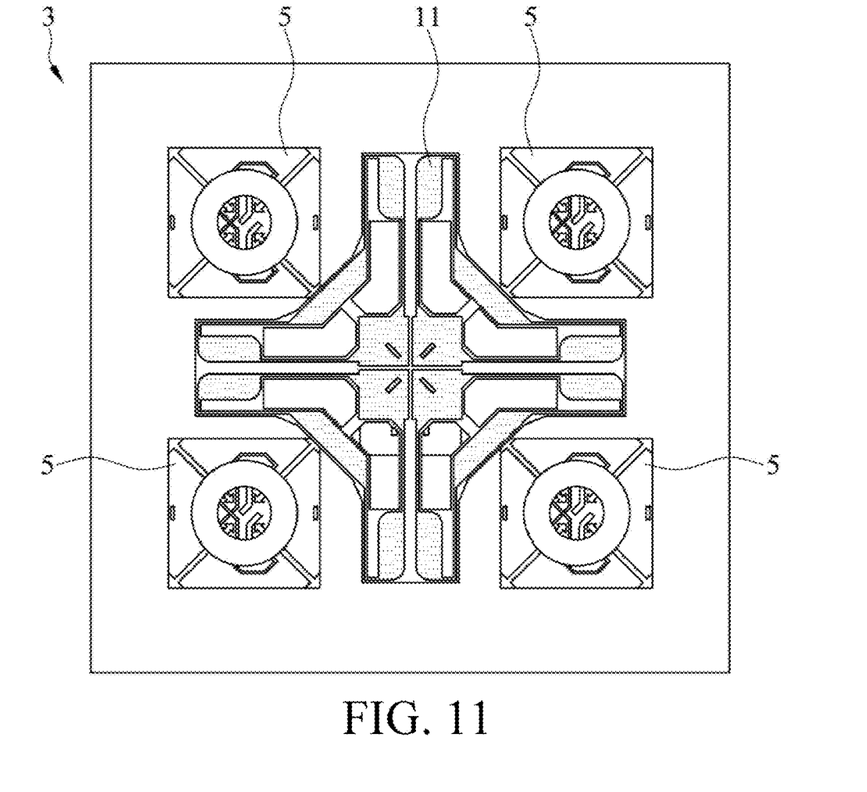
FIG. 11 is a top view of an antenna oscillator unit according to a second embodiment of the present invention.

FIG. 11 is a top view of an antenna oscillator unit 3 according to a second embodiment of the present invention. Compared with the first embodiment, a high-frequency oscillator 5 is further provided at an outer side of the antenna oscillator unit 3 of the second embodiment. Four high-frequency oscillators 5 are disposed around the low-frequency oscillator arms 11 herein. Four high-frequency oscillators 5 are disposed in directions of plus and minus 45 degrees of the four low-frequency oscillator arms 11 of the antenna oscillator unit 3. There is a gap between the high-frequency oscillator 5 and the avoidance opening 13. Such an arrangement can prevent the low-frequency oscillator arm 11 from shielding the high-frequency oscillator 5, thereby avoiding mutual coupling between a high frequency band and a low frequency band in a limited design space.

It may be understood that the high-frequency oscillator 5 also has necessary components such as a high-frequency oscillator arm, a balun support, and the like. Details are not described herein again.

Figure 12:
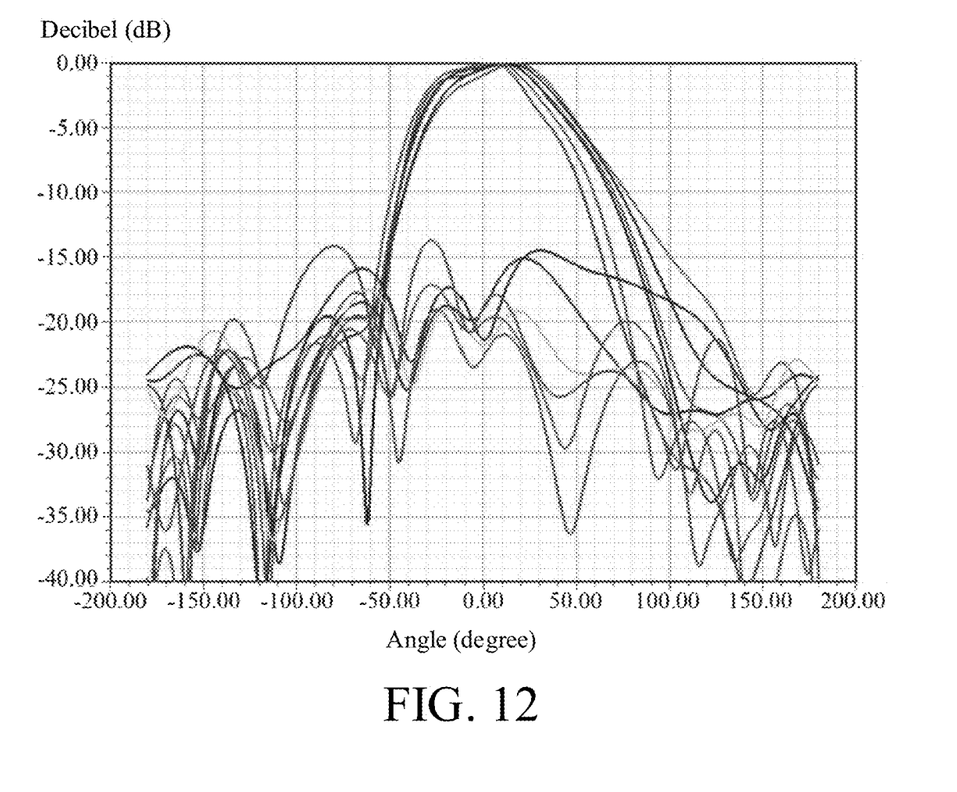
FIG. 12 is a horizontal plan view of a high-frequency oscillator according to the second embodiment of the present invention.

FIG. 12 is a horizontal plan view of the high-frequency oscillator 5 according to the second embodiment of the present invention. It may be seen that a horizontal beam width (HBW) at 3 dB is 57.1-66.2 degrees, a front-to-rear ratio within 30 degrees is −21.2 dB, cross polarization discrimination (XPD) at 0 degrees is −17.9 dB, and curvilinear distortion is small, which can meet usage requirements.

Figure 13:
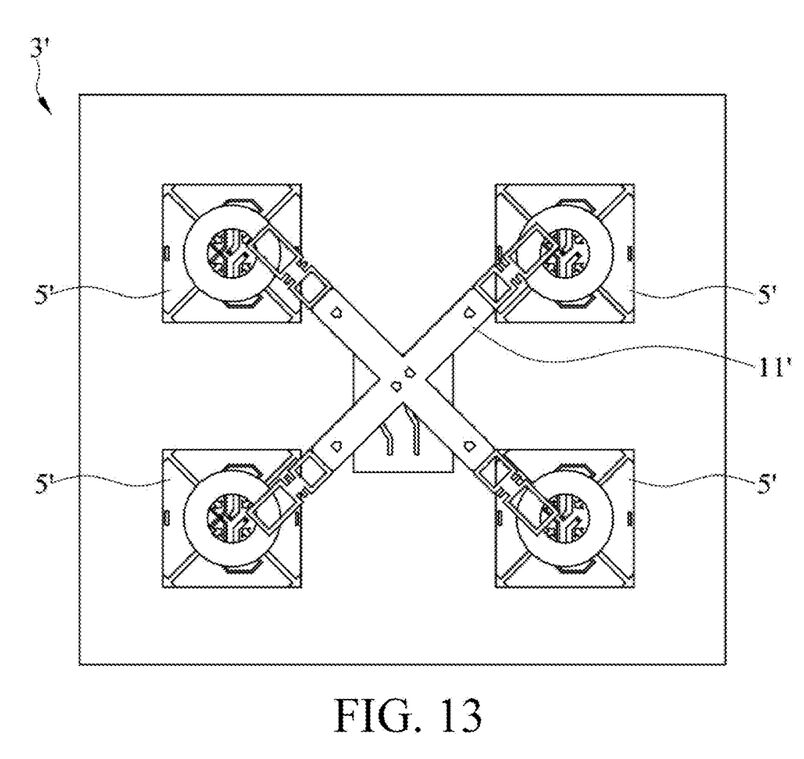
FIG. 13 is a top view of an antenna oscillator unit in the prior art.
Figure 14:
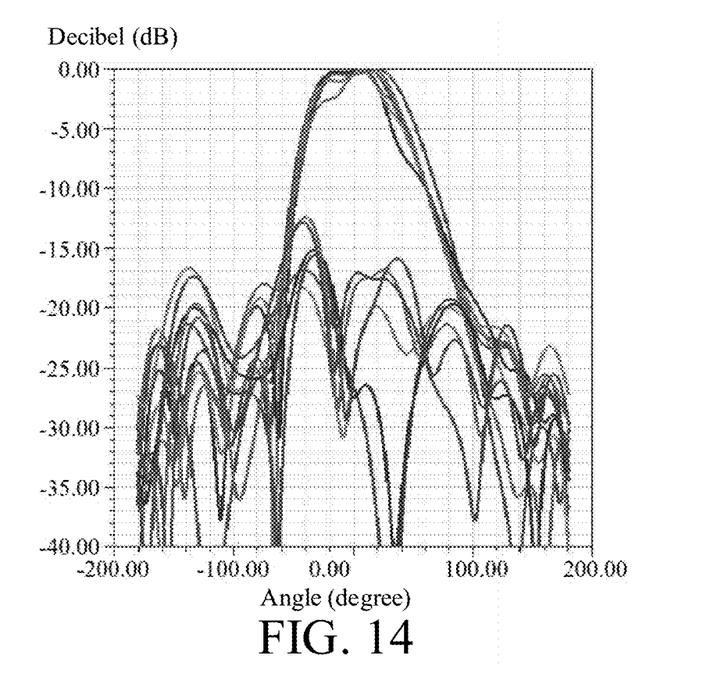
FIG. 14 is a horizontal plan view of a high-frequency oscillator in the prior art.

FIG. 13 and FIG. 14 are respectively a top view of an antenna oscillator unit 3' and a horizontal plan view of a high-frequency oscillator 5' in the prior art. All high-frequency oscillator 5' and low-frequency oscillator arms 11' of the antenna oscillator unit in the prior art are placed at plus and minus 45 degrees. As shown in FIG. 14, a horizontal beam width at 3 dB is 59.5-75.4 degrees, a front-to-rear ratio within 30 degrees is −21.8 dB, XPD is −17.5 dB at 0, and curvilinear distortion is large, which cannot meet usage requirements. In comparison of FIG. 12 with FIG. 14, it can be seen that the antenna oscillator unit 3 of the second embodiment of the present invention have a better signal than that in the prior art.

Based on the above, the present invention provides an antenna oscillator unit 3. The low-frequency oscillator arm 11 is designed to a triangular structure composed of two radiating sections 112 and a connecting section 114, so that shielding of the high-frequency oscillator 5 by the traditional oblique low-frequency oscillator arm 3' (for example, placed at minus 45 degrees) can be reduced, thus avoiding mutual coupling between a high frequency band and a low frequency band in a limited design space. In addition, the two radiating sections 112 are substantially perpendicular to each other and jointly generate polarization with the balun support 2 and achieve directions of polarization of plus and minus 45 degrees.

Furthermore, the connecting section 114 can eliminate a residual current at an end, optimize the purity of the polarization, improve isolation of heteropolarization, and effectively converge a beam width. In addition, a closed loop is formed by connecting the radiating sections 112 and the connecting section 114, which expands a coverage area of the low-frequency oscillator arm 11, thereby increasing structural strength of the low-frequency oscillator arm 11.

Certainly, the present invention may further have a plurality of other embodiments. A person skilled in the art may make various corresponding changes and variations according to the present invention without departing from the spirit and essence of the present invention. However, such corresponding changes and variations shall fall within the protection scope of the claims appended to the present invention.

What is claimed is:

1. An antenna oscillator unit, comprising a radiator and a balun support, wherein the radiator is fixed to the balun support, and the radiator comprises a plurality of low-frequency oscillator arms circumferentially distributed along the balun support, wherein each of the low-frequency oscillator arms comprises two radiating sections connected to each other and a connecting section connecting the two radiating sections to form a closed loop, wherein the two radiating sections are substantially perpendicular to each other,
   wherein the connecting section comprises two first connecting portions respectively connected to the two radiating sections of the corresponding low-frequency oscillator arm and a second connecting portion connected between the two first connecting portions, wherein an avoidance opening is formed between the two first connecting portions and the second connecting portion for avoiding a high-frequency oscillator,
   wherein each of the first connecting portions comprises a first connecting line parallel to one of the radiating sections of the adjacent low-frequency oscillator arm, and each of the first connecting portions further comprises a second connecting line connected to and perpendicular to the adjacent radiating section.

2. The antenna oscillator unit according to claim 1, wherein each of the first connecting portions further comprises a first loading block connected between the corresponding second connecting line and the corresponding radiating section.

3. The antenna oscillator unit according to claim 1, wherein the second connecting portion comprises a second loading block connected between the two first connecting portions.

4. The antenna oscillator unit according to claim 3, wherein included angles between an extension line of the second loading block and the two adjacent radiating sections are between 35 degrees and 55 degrees.

5. The antenna oscillator unit according to claim 3, wherein an extension line of the second loading block intersects with the two adjacent radiating sections to form two points of intersection, wherein a distance from each of the points of intersection to a center surrounded by the plurality of low-frequency oscillator arms is between 25 millimeters and 40 millimeters.

6. The antenna oscillator unit according to claim 1, wherein a number of the low-frequency oscillator arms is four, and two adjacent radiating sections of the two adjacent low-frequency oscillator arms are parallel to each other.

7. The antenna oscillator unit according to claim 1, wherein each of the low-frequency oscillator arms further comprises a plurality of loading blocks.

8. The antenna oscillator unit according to claim 1, wherein each of the low-frequency oscillator arms further comprises a bulk feeding portion connected between the two radiating sections.

9. The antenna oscillator unit according to claim 1, wherein the radiator further comprises a substrate, wherein the plurality of low-frequency oscillator arms are disposed on the substrate.

10. The antenna oscillator unit according to claim 1, wherein a mounting groove mating with the balun support is provided on each of the low-frequency oscillator arms.

11. The antenna oscillator unit according to claim 1, wherein the balun support comprises two cross-engaged balun boards, wherein each of the balun boards has a first surface, a second surface opposite to the first surface, a feeding line on the first surface, and a balun line on the second surface.

12. The antenna oscillator unit according to claim 11, wherein the feeding line comprises a plurality of bulk portions and a plurality of zigzag portions that are alternately connected.

13. The antenna oscillator unit according to claim 11, wherein the balun line comprises two elongated balun blocks respectively arranged on both sides of the other of the balun boards.

14. The antenna oscillator unit according to claim 1, further comprising a feeding board fixed to the balun support.

* * * * *